United States Patent
Mizusaki et al.

(10) Patent No.: US 11,024,357 B1
(45) Date of Patent: Jun. 1, 2021

(54) NONVOLATILE MEMORY CELL AND NONVOLATILE MEMORY DEVICE COMPRISING THE SAME

(71) Applicant: Samsung Electronics Co., Ltd., Suwon-si (KR)

(72) Inventors: Soichiro Mizusaki, Suwon-si (KR); Jungho Yoon, Yongin-si (KR); Youngjin Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/876,553

(22) Filed: May 18, 2020

(30) Foreign Application Priority Data

Dec. 18, 2019 (KR) .................. 10-2019-0170072

(51) Int. Cl.
*G11C 11/22* (2006.01)
*H01L 29/78* (2006.01)
*H01L 29/51* (2006.01)

(52) U.S. Cl.
CPC ........ *G11C 11/223* (2013.01); *G11C 11/2273* (2013.01); *G11C 11/2275* (2013.01); *H01L 29/516* (2013.01); *H01L 29/78391* (2014.09)

(58) Field of Classification Search
CPC ............. G11C 11/223; G11C 11/2273; G11C 11/2275; H01L 29/78391
USPC .................................................. 365/145, 158
See application file for complete search history.

(56) References Cited

U.S. PATENT DOCUMENTS

| | | | | |
|---|---|---|---|---|
| 6,151,240 A * | 11/2000 | Suzuki | .................... | H01L 28/55 257/295 |
| 6,940,740 B2 * | 9/2005 | Ueda | ....................... | G11C 11/22 257/E21.664 |
| 7,732,847 B2 * | 6/2010 | Tanaka | ................ | H01L 29/6684 257/295 |
| 7,842,989 B2 * | 11/2010 | Kato | ....................... | G11C 11/22 257/295 |

(Continued)

OTHER PUBLICATIONS

Akihito Sawa, 'Resistive switching in transition metal oxides' *Materials Today*, vol. 11, No. 6, Jun. 2008, pp. 28-36.

(Continued)

*Primary Examiner* — Michael T Tran
(74) *Attorney, Agent, or Firm* — Harness, Dickey & Pierce, P.L.C.

(57) ABSTRACT

A nonvolatile memory cell resistance change type nonvolatile memory cell configured to store information by changing an electrical resistance according to application of electrical stress is provided and a nonvolatile memory device including the nonvolatile memory cell is provided. The resistance change type nonvolatile memory cell includes a resistance change material layer including a resistance change material; a ferroelectric layer on a first side of the resistance change material layer, the ferroelectric layer configured to change an electrical resistance of the resistance change material layer according to a polarization direction and polarization size of a ferroelectric therein; a first electrode on the ferroelectric layer and configured to control the polarization direction and the polarization size of the ferroelectric based on an applied voltage; and a second electrode and a third electrode on the resistance change material layer with the first electrode therebetween.

25 Claims, 25 Drawing Sheets

(56) References Cited

U.S. PATENT DOCUMENTS

| | | | |
|---|---|---|---|
| 10,700,093 B1* | 6/2020 | Kalitsov | G11C 11/2273 |
| 2005/0063214 A1* | 3/2005 | Takashima | G11C 11/22 |
| | | | 365/145 |
| 2006/0027847 A1* | 2/2006 | Koo | H01L 27/11502 |
| | | | 257/295 |
| 2007/0236979 A1* | 10/2007 | Takashima | H01L 27/105 |
| | | | 365/145 |
| 2009/0097299 A1* | 4/2009 | Tanaka | H01L 27/10 |
| | | | 365/145 |
| 2009/0168505 A1* | 7/2009 | Hanzawa | G11C 13/0023 |
| | | | 365/163 |
| 2009/0173978 A1* | 7/2009 | Kato | H01L 27/1159 |
| | | | 257/295 |
| 2009/0224301 A1* | 9/2009 | Yamakawa | H01L 28/82 |
| | | | 257/295 |
| 2009/0290404 A1* | 11/2009 | Kaneko | H01L 29/78391 |
| | | | 365/145 |
| 2010/0277969 A1 | 11/2010 | Li et al. | |
| 2011/0299318 A1* | 12/2011 | Kaneko | H01L 29/516 |
| | | | 365/145 |
| 2014/0169067 A1 | 6/2014 | Hwang et al. | |
| 2016/0005961 A1* | 1/2016 | Ino | H01L 45/06 |
| | | | 257/4 |
| 2017/0213869 A1 | 7/2017 | Read et al. | |
| 2017/0237002 A1 | 8/2017 | Rebello et al. | |
| 2018/0358542 A1* | 12/2018 | Mihajlovic | G11C 11/1659 |
| 2020/0161328 A1 | 5/2020 | Yoon et al. | |

OTHER PUBLICATIONS

Ilia Valov et al., 'Corrigendum' *Nanotechnology*, vol. 22, 2011, 254003.

Astrid Marchewka et al., 'Nanoionic Resistive Switching Memories: On the Physical Nature of the Dynamic Reset Process' *Advanced Electronic Materials*, 2016, 2, 1500233.

* cited by examiner

NONVOLATILE MEMORY CELL AND NONVOLATILE MEMORY DEVICE COMPRISING THE SAME

CROSS-REFERENCE TO RELATED APPLICATION

This application claims the benefit of Korean Patent Application No. 10-2019-0170072, filed on Dec. 18, 2019, in the Korean Intellectual Property Office, the disclosure of which is incorporated herein in its entirety by reference.

BACKGROUND

1. Field

The present disclosure relates to nonvolatile memory cells and nonvolatile memory devices including the nonvolatile memory cells.

2. Description of Related Art

A nonvolatile memory device, which is a semiconductor memory device, includes a plurality of nonvolatile memory devices that retain information even when power thereto is cut off so that stored information may be used again when the power is turned on. As an example of the nonvolatile memory device, a resistive switching RAM (ReRAM) of the related art is implemented in a metal-insulator-metal (MIM) structure in which a resistance change material is positioned between electrodes.

Nonvolatile memory devices may be used in cellular phones, digital cameras, portable digital assistants (PDAs), mobile computer devices, fixed computer devices, and other devices. Research has been recently conducted on the use of three-dimensional (or vertical) NAND on chips for next-generation neuromorphic computing platforms or neural networks.

SUMMARY

Provided are nonvolatile memory cells and nonvolatile memory devices including the nonvolatile memory cells.

Provided are nonvolatile memory cells with improved electrical characteristics and/or nonvolatile memory devices including the nonvolatile memory cells.

Features and/or effects of inventive concepts are not limited to those described above, and other features and/or effects of inventive concepts may be present.

Additional aspects will be set forth in part in the description which follows and, in part, will be apparent from the description, or may be learned by practice of the presented embodiments of the disclosure.

According to an aspect of an embodiment, a resistance change type nonvolatile memory cell may be configured to store information by changing an electrical resistance according to application of electrical stress is provided. The resistance change nonvolatile memory cell includes a resistance change material layer including a resistance change material; a ferroelectric layer on a first side of the resistance change material layer, the ferroelectric layer configured to change an electrical resistance of the resistance change material layer according to a polarization direction and polarization size of a ferroelectric therein; one or a plurality of first electrodes on the ferroelectric layer, the one or the plurality of first electrodes configured to control the polarization direction and the polarization size of the ferroelectric based on a voltage applied to the one or the plurality of first electrodes; and a second electrode and a third electrode on the resistance change material layer with the one or the plurality of first electrodes therebetween.

In some embodiments, the resistance change material layer may have a flat plate shape.

In some embodiments, the second electrode and the third electrode may be between the resistance change material layer and the ferroelectric layer or the second electrode and the third electrode may be on the ferroelectric layer.

In some embodiments, the ferroelectric layer may be on an upper surface of the resistance change material layer, and the resistance change type nonvolatile memory cell may further include a fourth electrode or an insulator on a lower surface of the resistance change material layer.

In some embodiments, the resistance change material layer may have a cylindrical shape, the ferroelectric layer may be provided around an outer wall of the resistance change material layer, the one or the plurality of first electrodes may be provided around an outer wall of the ferroelectric layer, and the second electrode and the third electrode may have be provided around the outer wall of the resistance change material layer with the one or the plurality of first electrodes therebetween.

In some embodiments, the second electrode and the third electrode may be between the resistance change material layer and the ferroelectric layer or on the outer wall of the ferroelectric layer.

In some embodiments, the resistance change type nonvolatile memory cell may further include a fourth electrode or an insulator on an inner wall of the resistance change material layer. The fourth electrode or the insulator may have a cylindrical shape.

In some embodiments, the one or the plurality of first electrodes may be a plurality of first electrodes, and the plurality of first electrodes may be spaced apart from each other along a separation direction in which the second electrode and the third electrode are spaced apart from each other.

In some embodiments, the ferroelectric layer may include at least one of an oxide including Hf, an oxide including Ba and Ti, an oxide including Pb and Zr, and an oxide including Bi and Fe.

In some embodiments, the oxide including Hf may be $HfO_2$ or $Hf_{1-x}T_xO_y$ (where $0<x<1$, $y>0$, and T=Al, Zr, Si, Ge, Sn, In, Ga, Sb, Ti, La, Ta, W, Mo, Nb, Y, rare earth, Mg, Ca, Sr, and Ba).

In some embodiments, the resistance change material layer may include a bicomponent oxide, a tricomponent oxide, or a tetracomponent oxide.

In some embodiments, the one or the plurality of first electrodes, the second electrode, and the third electrode may include an oxide having conductivity, a nitride having conductivity, or a metal.

In some embodiments, the one or the plurality of first electrodes may be one or more gate electrodes, the second electrode may be a source electrode, and the third electrode may be a drain electrode.

In some embodiments, the resistance change material layer may be grounded.

According to an aspect of another embodiment, a resistance change type nonvolatile semiconductor memory cell includes: a substrate; a resistance change material layer including a resistance change material on an upper surface of the substrate; a ferroelectric layer provided on the resistance change material layer to change an electrical resistance of the resistance change material layer according to a polarization direction and polarization size of a ferroelectric; one or a plurality of first electrodes on the ferroelectric layer and to which a voltage for controlling the polarization direction and the polarization size of the ferroelectric is applied; and a second electrode and a third electrode respectively provided on the resistance change material layer with the one or the of first electrodes therebetween.

According to an aspect of another embodiment, a resistance change type nonvolatile semiconductor memory cell includes: a resistance change material layer having a cylindrical shape and including a resistance change material; a ferroelectric layer provided on an outer wall of a cylindrical shape of the resistance change material layer to change an electrical resistance of the resistance change material layer according to a polarization direction and polarization size of a ferroelectric therein; one or a plurality of first electrodes on an outer wall of the ferroelectric layer and to which a voltage for controlling the polarization direction and the polarization size of the ferroelectric is applied; and a second electrode and a third electrode respectively provided on the outer wall of the resistance change material layer with the one or the of first electrodes therebetween.

According to an aspect of another embodiment, a resistance change type nonvolatile memory device includes one of the above resistance change type nonvolatile memory cells; and processing circuitry, the processing circuitry configured to apply the electrical stress to the one or the plurality of first electrodes of the resistance change type nonvolatile memory cell, change the electrical resistance of the resistance change material layer of the resistance change type nonvolatile memory cell, and write and delete information, and the processing circuitry configured to apply a voltage to each of the second electrode and the third electrode of the resistance change type nonvolatile memory cell, detect an electrical resistance in an amount of current flowing between the second electrode and the third electrode, and read stored information.

In some embodiments, the processing circuitry may be configured to switch a forward bias voltage and a backward bias voltage with respect to an interface of the resistance change material layer and the ferroelectric layer of the resistance change type nonvolatile memory cell as the electrical stress during a read operation and a delete operation and change a resistance of the resistance change type nonvolatile memory cell.

In some embodiments, the processing circuitry may be configured to switch a forward bias voltage and a backward bias voltage with respect to a ferroelectric layer of the resistance change type nonvolatile memory cell as the electrical stress during a write operation and a delete operation and change a resistance of the resistance change material layer of the resistance change type nonvolatile memory cell.

In some embodiments, the one or the plurality of first electrodes may be the plurality of first electrodes, and the processing circuitry may be configured to independently adjust voltages with respect to the plurality of first electrodes and calibrate a resistance of the resistance change material layer of the resistance change type nonvolatile memory cell.

In some embodiments, the resistance change type nonvolatile memory device may include a plurality of the resistance change type nonvolatile memory cells, the plurality of resistance change type nonvolatile memory cells may include the resistance change type nonvolatile memory cell, and the processing circuitry may be configured to control a polarization direction and a polarization size of a ferroelectric layer of each of the plurality of resistance change type nonvolatile memory cells and calibrate resistances of resistance change material layers of the plurality of resistance change type nonvolatile memory cells.

According to an aspect of another embodiment, a resistance change type nonvolatile memory cell includes a resistance change material layer including a resistance change material; a ferroelectric layer contacting the resistance change material layer, the ferroelectric layer configured to change an electrical resistance of the resistance change material layer according to a polarization direction and a polarization size of a ferroelectric therein; and a plurality of electrodes contacting the resistance change material layer and spaced apart from each other. The plurality of electrodes include a first electrode electrically connected to the ferroelectric layer, a second electrode on a first end of the resistance change material layer, and a third electrode on a second end of the resistance change material layer, and the first electrode may be configured to control the polarization direction and the polarization size of the ferroelectric based on a voltage applied to the first electrode.

In some embodiments, the ferroelectric layer may include at least one of an oxide comprising Hf, an oxide comprising Ba and Ti, an oxide comprising Pb and Zr, and an oxide comprising Bi and Fe.

In some embodiment, the ferroelectric layer may include $HfO_2$ or $Hf_{1-x}T_xO_y$ (where $0<x<1$, $y>0$, and T=Al, Zr, Si, Ge, Sn, In, Ga, Sb, Ti, La, Ta, W, Mo, Nb, Y, rare earth, Mg, Ca, Sr, and Ba).

In some embodiment, the resistance change material layer may include a bicomponent oxide, a tricomponent oxide, or a tetracomponent oxide.

According to another embodiment, a resistance change type nonvolatile memory device includes the resistance change type nonvolatile memory cell.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
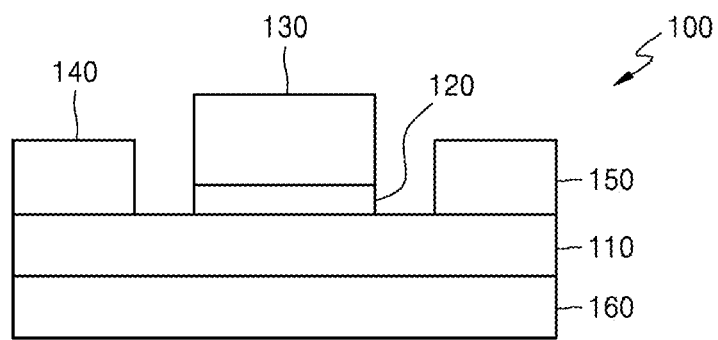
FIG. 1 is a structural diagram of a nonvolatile memory cell according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

The principle of the present disclosure is explained and embodiments are disclosed so that the scope of the present disclosure is clarified and one of ordinary skill in the art to which the present disclosure pertains implements the present disclosure. The disclosed embodiments may have various forms.

In the present specification, all elements of embodiments are not explained, but general matters in the technical field of the present disclosure or redundant matters between embodiments will not be described. Throughout the specification, like reference numerals or characters refer to like elements.

In the drawings, sizes of elements may be exaggerated for clarity and convenience of explanation. Furthermore, the connecting lines, or connectors shown in the various figures presented are intended to represent example functional relationships and/or physical or logical couplings between the various elements. It should be noted that many alternative or additional functional relationships, physical connections or logical connections may be present in a practical device.

It will be understood that when an element is referred to as being "on" or "above" another element used in the specification, the element may be in direct contact with the other element or other intervening elements may also be present.

Hereinafter, embodiments of the present disclosure and the operating principle of the embodiments will be described with reference to the accompanying drawings.

FIG. 1 is a structural diagram of a nonvolatile memory cell 100 according to an embodiment.

Referring to FIG. 1, the nonvolatile memory cell 100 includes a resistance change material layer 110 that stores information by changing an electrical resistance with the application of an electrical stress.

The resistance change material layer 110 includes a resistance change material. The resistance change material is a material whose resistance changes with the application of the electrical stress and may change by oxygen vacancy or phase.

In an example, when the resistance of the resistance change material layer 110 changes by oxygen vacancy, the resistance change material layer 110 may include an oxide layer or a nitride layer. When the resistance change material layer 110 includes the oxide layer, the oxide layer may include a bicomponent oxide, a tricomponent oxide, or a tetracomponent oxide. For example, the oxide layer may include $HfO_2$, $Al_2O_3$, $Ta_2O_5$, $TiO_2$, or a combination thereof, but is not limited thereto. When the resistance change material layer 110 includes the nitride layer, the nitride layer may include, for example, SiN, but is not limited thereto. In an example, the resistance of the resistance change material layer 110 may change according to the density of oxygen vacancy inside the resistance change material layer 110. When the density of oxygen vacancy inside the resistance change material layer 110 is high, the resistance change material layer 110 may have a low resistance state. When the density of oxygen vacancy inside the resistance change material layer 110 is low, the resistance change material layer 110 may have a high resistance state. In an example, the resistance of the resistance change material layer 110 may change according to whether electrons are trapped in a trap inside the resistance change material layer 110. The trap may be formed by oxygen vacancy. When electrons are trapped in the trap inside the resistance change material layer 110, the resistance change material layer 110 may have a low resistance state. When the electrons are not trapped in the trap inside the resistance change material layer 110, the resistance change material layer 110 may have a high resistance state.

In an example, the resistance change material layer 110 may include a phase change material. For example, the resistance change material layer 110 may include GST ($Ge_2Sb_2Te_5$). When the resistance change material layer 110 has a crystalline state, the resistance change material layer 110 may have a low resistance state. When the resistance change material layer 110 has an amorphous state, the resistance change material layer 110 may have a high resistance state.

The nonvolatile memory cell 100 may be formed in a flat plate shape. For example, the resistance change material layer 110 may be formed in parallel on a flat substrate (not shown).

A ferroelectric layer 120 is provided on the resistance change material layer 110. The ferroelectric layer 120 includes a ferroelectric having polarization (spontaneous polarization) by itself without an external electric field. The ferroelectric is a material whose polarization direction may change by the external electric field. For example, the ferroelectric layer 120 may be formed of at least one of an oxide including Hf, an oxide including Ba and Ti, an oxide including Pb and Zr, and an oxide including Bi and Fe. The oxide including Hf is, for example, $HfO_2$ or $Hf_{1-x}T_xO_y$, where $0<x<1$, $y>0$, and T=Al, Zr, Si, Ge, Sn, In, Ga, Sb, Ti, La, Ta, W, Mo, Nb, Y, rare earth, Mg, Ca, Sr, and Ba. As described later, the resistance of the resistance change material layer 110 may change by adjusting the polarization direction and the polarization size of the ferroelectric layer 120.

A first electrode 130 is provided on the ferroelectric layer 120. The first electrode 130 may include an oxide having conductivity, a nitride having conductivity, or a metal. A voltage used to write information to the nonvolatile memory cell 100 or to control the polarization direction and the polarization size of the ferroelectric layer 120 is applied to the first electrode 130. The first electrode 130 may be understood as a gate electrode.

A second electrode 140 and a third electrode 150 are provided on the resistance change material layer 110 with the first electrode 130 interposed therebetween. The second electrode 140 and the third electrode 150 may be positioned between the resistance change material layer 110 and the ferroelectric layer 120. The second electrode 140 and the third electrode 150 may include an oxide having conductivity, a nitride having conductivity, or a metal. The second electrode 140 and the third electrode 150 may be understood as source and drain electrodes, respectively.

A fourth electrode 160 may be provided on a lower surface of the resistance change material layer 110. The fourth electrode 160 may include an oxide having conductivity, a nitride having conductivity, or a metal. The fourth electrode 160 may be grounded. In place of the fourth electrode 160, an insulator may be provided on the lower surface of the resistance change material layer 110, and the insulator may be grounded. The substrate itself described above may be understood as the insulator.

Figure 24:
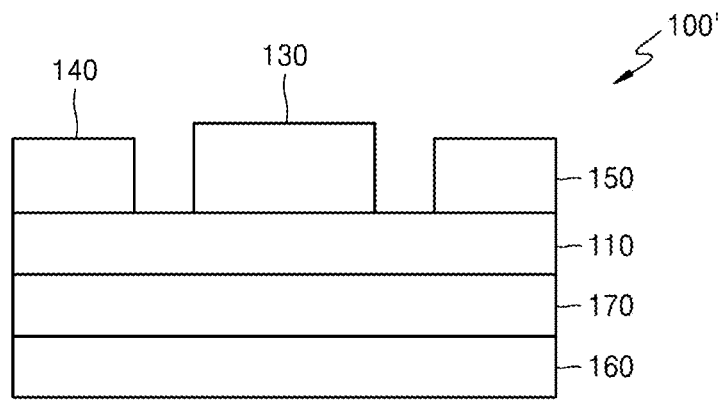
FIGS. 24 and 25 are structural diagrams of nonvolatile memory cells according to embodiments.
Figure 25:
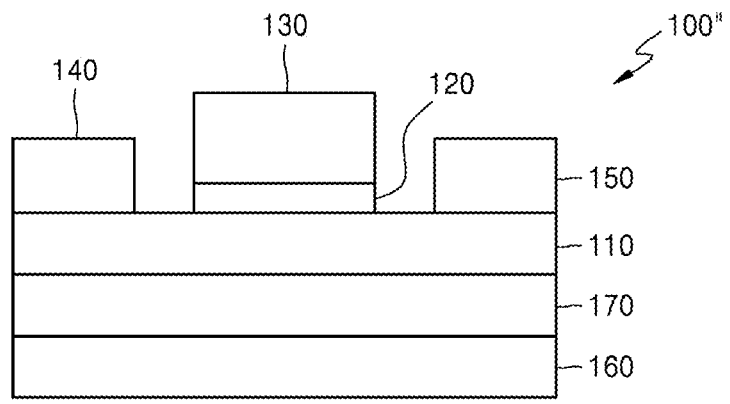

Although FIG. 1 illustrates an example where the nonvolatile memory cell 100 includes the ferroelectric layer 120 between the first electrode 130 and resistance change material layer 110, inventive concepts are not limited thereto. In an embodiment, as depicted in FIG. 24, the ferroelectric layer 120 may be omitted in a nonvolatile memory cell 100' and a ferroelectric layer 170 may be formed in the nonvolatile memory cell 100' between the resistance change material layer 110 and the fourth electrode 160. Alternatively, in an embodiment as depicted in FIG. 25, a nonvolatile memory cell 100" may include both the ferroelectric layer 120 of FIG. 1 and the ferroelectric layer 170 of FIG. 24.

The ferroelectric layer 170 includes a ferroelectric having polarization (spontaneous polarization) by itself without an external electric field. The ferroelectric is a material whose polarization direction may change by the external electric field. For example, the ferroelectric layer 170 may be formed of at least one of an oxide including Hf, an oxide including Ba and Ti, an oxide including Pb and Zr, and an oxide including Bi and Fe. The oxide including Hf is, for example, $HfO_2$ or $Hf_{1-x}T_xO_y$, where $0<x<1$, $y>0$, and T=Al, Zr, Si, Ge, Sn, In, Ga, Sb, Ti, La, Ta, W, Mo, Nb, Y, rare earth, Mg, Ca, Sr, and Ba. A material of the ferroelectric layers 120 and 170 may be the same or different.

Next, referring to FIGS. 2 to 8, the operation of the nonvolatile memory cell 100 of the present embodiment will be described.

Figure 2:
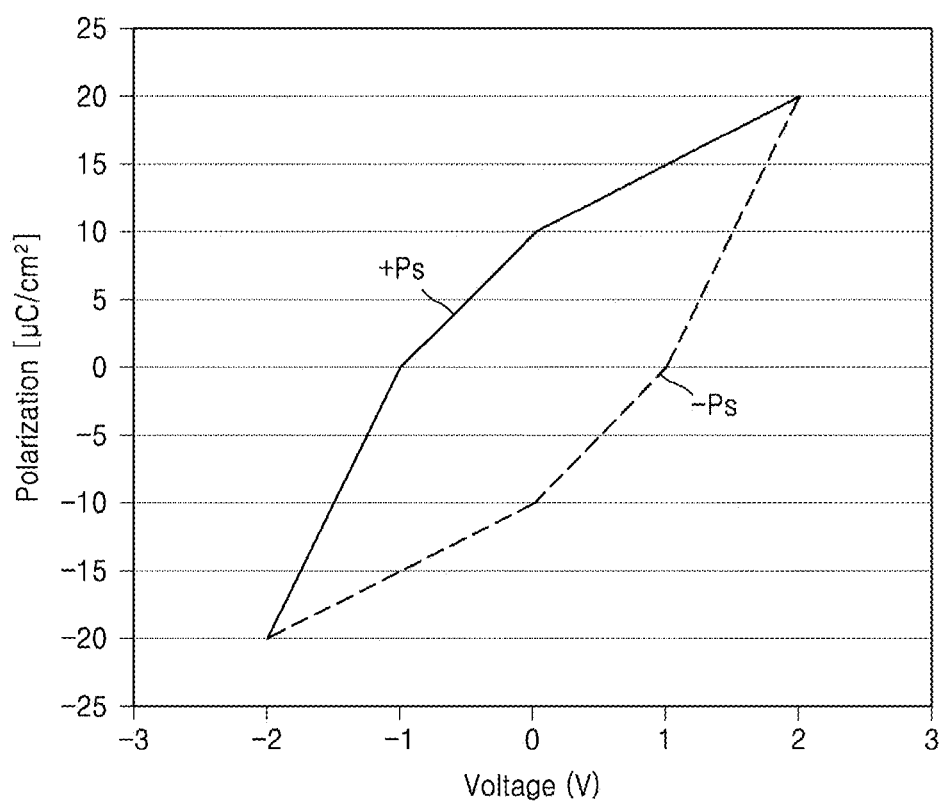
FIG. 2 is a graph illustrating polarization characteristics of a ferroelectric layer of the nonvolatile memory cell of FIG. 1.

FIG. 2 is a graph illustrating polarization characteristics of the ferroelectric layer 120 of the nonvolatile memory cell 100 of the present embodiment. In FIG. 2, the horizontal axis represents a gate voltage applied to the first electrode 110, and the vertical axis represents the polarization of the ferroelectric layer 120. FIG. 2 shows that the polarization direction and the polarization size of the ferroelectric layer 120 may change according to the gate voltage applied to the first electrode 110. When the gate voltage applied to the first electrode 110 changes from −2V to +2V, the polarization size of the ferroelectric layer 120 changes along the dotted line from approximately −20 $\mu C/cm^2$ to approximately +20 $\mu C/cm^2$. Meanwhile, it may be seen that when the gate voltage changes from −2V to +2V, the ferroelectric layer 120 has a polarization direction of −Ps from −2V to approximately +1V, and when the gate voltage is greater than approximately 1V, the polarization direction changes to +Ps. Meanwhile, it may be seen that when the gate voltage applied to the first electrode 110 changes from +2V to −2V, the polarization size of the ferroelectric layer 120 changes along the solid line, and the ferroelectric layer 120 has a polarization direction of +Ps from +2V to approximately −1V, and the polarization direction changes to −Ps when the gate voltage is less than approximately −1V.

Figure 3:
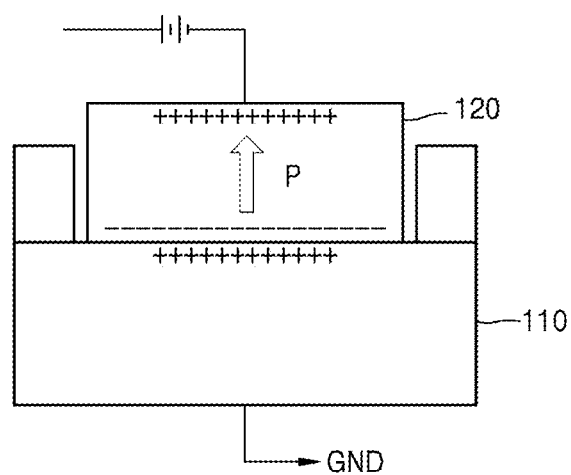
FIG. 3 illustrates a case in which a gate voltage is applied to the ferroelectric layer of the nonvolatile memory cell of FIG. 1 such that up-state polarization occurs.
Figure 4:
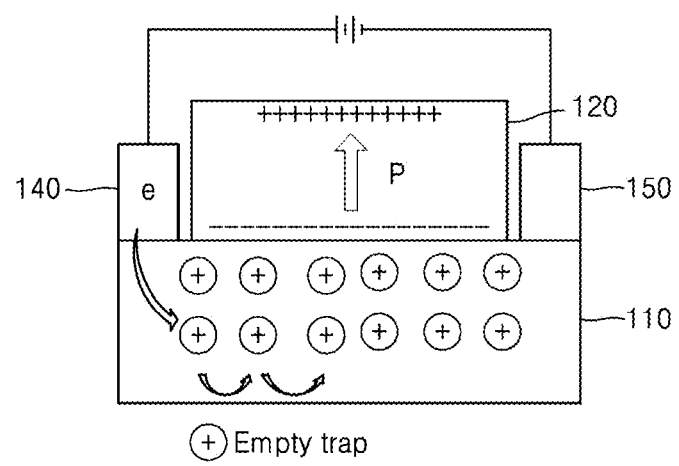
FIG. 4 is a diagram illustrating a high resistance of the nonvolatile memory cell in the up-state polarization of FIG. 3.

FIG. 3 illustrates a case in which a gate voltage is applied to the ferroelectric layer 120 of the nonvolatile memory cell 100 of the present embodiment such that polarization in an up-state occurs, and FIG. 4 is a diagram illustrating a high resistance of the nonvolatile memory cell 100 in the up polarization state of FIG. 3. Referring to FIG. 3, when a negative gate voltage is applied to the ferroelectric layer 120, the polarization in the up-state occurs in the ferroelectric layer 120, and thus, positive charges are induced at an interface of the resistance change material layer 110 toward the ferroelectric layer 120. In other words, as shown in FIG. 4, due to the polarization in the up-state of the ferroelectric layer 120, holes are accumulated toward the interface of the resistance change material layer 110 and the holes accumulated at the interface of the resistance change material layer 110 cause combination/dissociation with/from a trap of the resistance change material layer 110 to reduce a carrier concentration and thus, the nonvolatile memory cell 100 is in a high resistance state.

Figure 5:
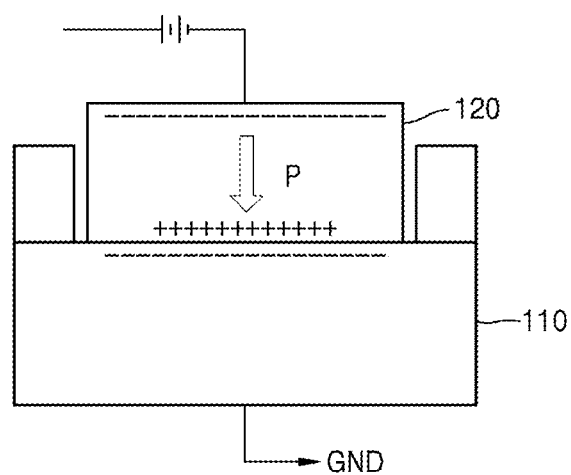
FIG. 5 illustrates a case in which a gate voltage is applied to the ferroelectric layer of the nonvolatile memory cell of FIG. 1 such that down-state polarization occurs.
Figure 6:
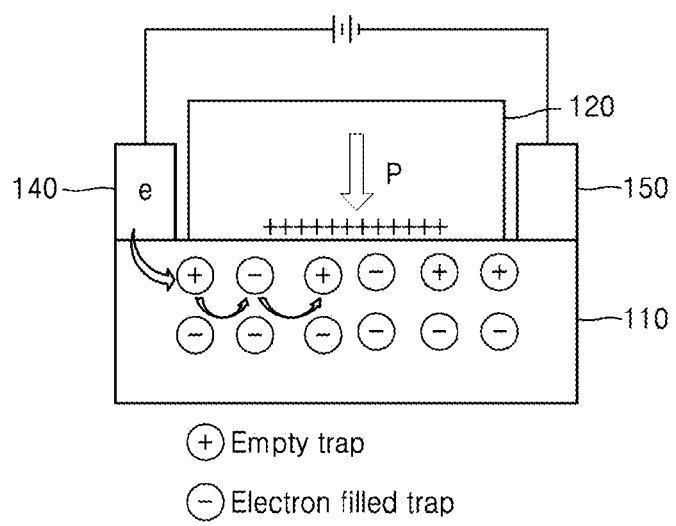
FIG. 6 is a diagram illustrating a low resistance of the nonvolatile memory cell in the down-state polarization of FIG. 5.

FIG. 5 illustrates a case in which a gate voltage is applied to the ferroelectric layer 120 of the nonvolatile memory cell 100 of the present embodiment such that polarization in a down-state occurs, and FIG. 6 is a diagram illustrating a low resistance of the nonvolatile memory cell 100 in the down polarization state of FIG. 5. Referring to FIG. 5, when a positive gate voltage is applied to the ferroelectric layer 120, the polarization in the down-state occurs in the ferroelectric layer 120, and thus, negative charges are induced at an interface of the resistance change material layer 110 toward the ferroelectric layer 120. In other words, as shown in FIG. 6, due to the polarization in the down-state of the ferroelectric layer 120, holes are accumulated toward the interface of the resistance change material layer 110 and the holes accumulated at the interface of the resistance change material layer 110 cause combination/dissociation with/from a trap of the resistance change material layer 110 to increase a carrier concentration and thus, the nonvolatile memory cell 100 is in a low resistance state.

Figure 7:
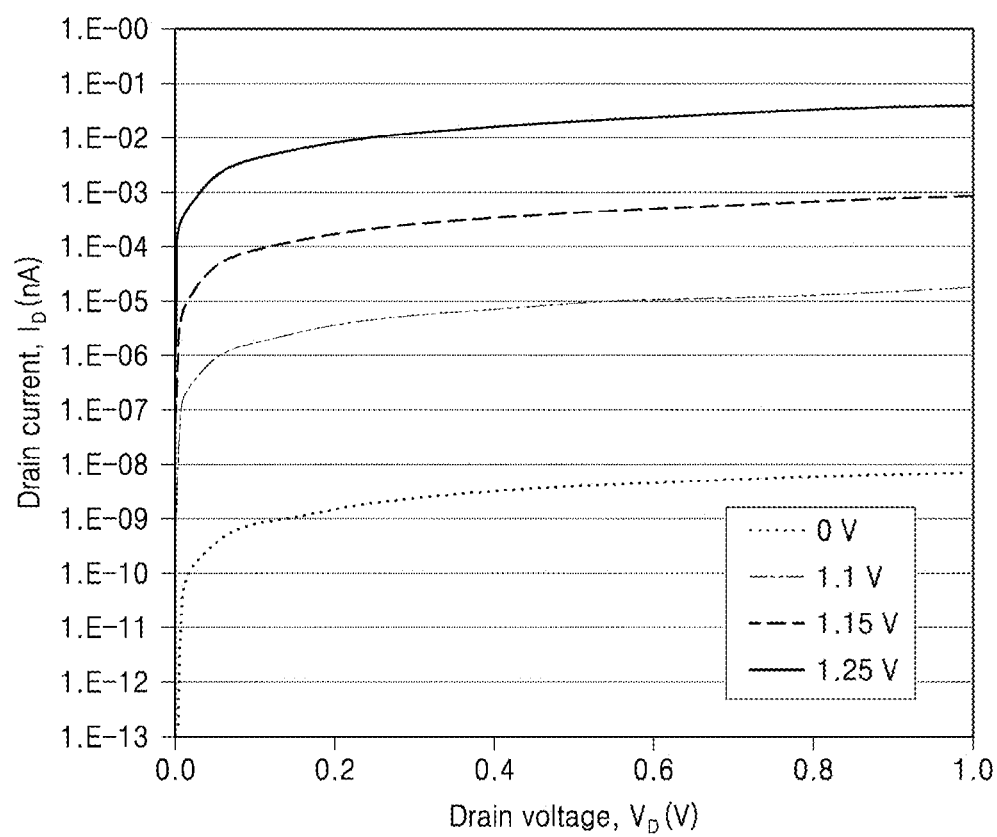
FIG. 7 is a graph showing the relationship between a drain voltage and a drain current with respect to a given gate voltage in the nonvolatile memory cell of FIG. 1.

FIG. 7 is a graph showing the relationship between a drain voltage and a drain current with respect to a given gate voltage in the nonvolatile memory cell 100 of the present embodiment. Referring to FIG. 7, it may be seen that based on the case where the gate voltage is not applied to the first electrode 130 (that is, the case where the gate voltage is 0 V), the larger the positive gate voltage applied to the first electrode 130, the greater the drain current flowing between the second electrode 140 and the third electrode 150 with respect to the same drain voltage. Here, the drain voltage means a voltage applied between the second electrode 140 and the third electrode 150. As described with reference to FIGS. 5 and 6, the characteristics of the drain voltage and the drain current with respect to the given gate voltage shown in FIG. 7 may be understood that the greater the positive gate voltage applied to the first electrode 130, the greater the down polarization size of the ferroelectric layer 120, and that the resistance of the resistance change material layer 110 decreases.

Figure 8:
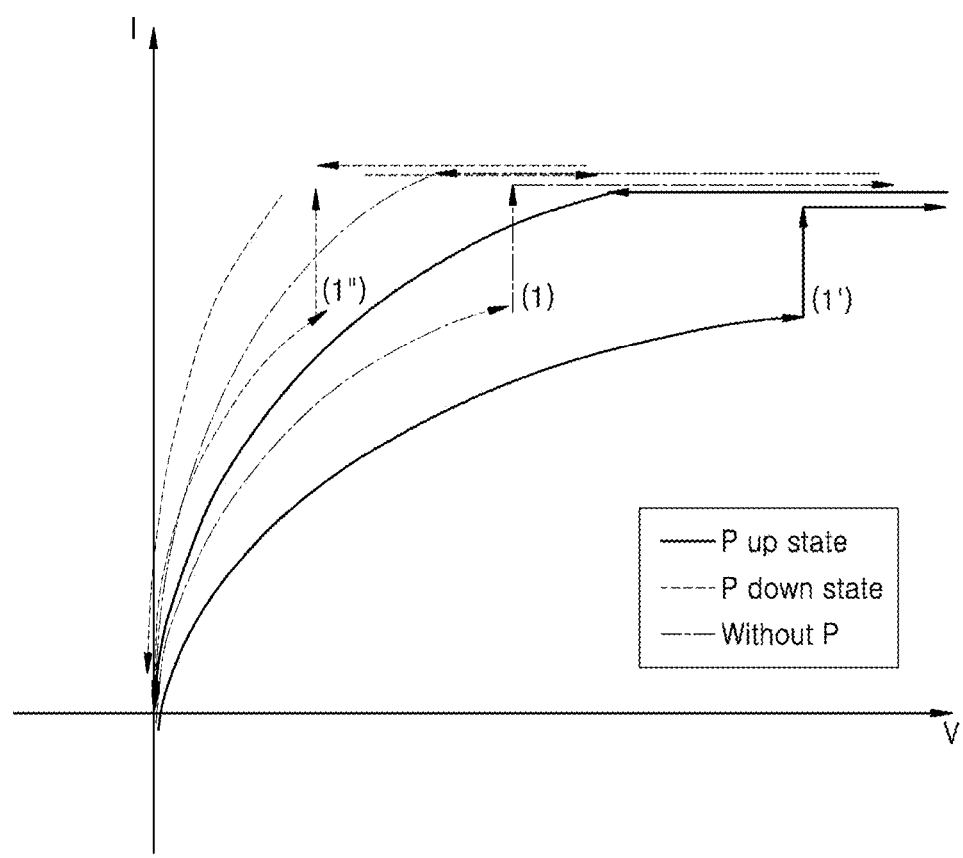
FIG. 8 is a graph illustrating a current-voltage relationship of a resistance change material layer according to a polarization state of a ferroelectric layer in the nonvolatile memory cell of FIG. 1.

FIG. 8 is a graph illustrating a current-voltage relationship of the resistance change material layer 110 according to a polarization state of the ferroelectric layer 120 in the nonvolatile memory cell 100 of FIG. 1. The x axis represents the drain voltage and the y axis represents the drain current. Referring to FIG. 8, an alternated long and short dash line indicates a current-voltage curve (1) when there is no polarization. A solid line indicates a current-voltage curve (1') when there is the ferroelectric layer 120 in the up-state. When the resistance of the resistance change material layer 110 increases due to the polarization of the ferroelectric layer 120 in the up-state, a current-voltage curve (1') moves down in the curve (1) when there is no ferroelectric layer 120 (that is, when there is no polarization). Meanwhile, an alternate long and two short dashes line indicates a current-voltage curve (1") when there is the ferroelectric layer 120 in the down-state. When the resistance of the resistance change material layer 110 is reduced due to the polarization of the ferroelectric layer 120 in the down-state, the current-voltage curve (1") moves up in the curve (1) when there is no ferroelectric layer 120 (that is, when there is no polarization).

As described above, when the polarization direction and the polarization size of the ferroelectric layer 120 are determined through the gate voltage, a resistance value of the surface of the resistance change material layer 110 is determined, thereby performing information storage (e.g., a write operation) in a low resistance state and a high resistance state of the resistance change material layer 110. In addition, the drain voltage is applied between the second electrode 140 and the third electrode 150, the drain current flowing therebetween is detected, and the low resistance state and the high resistance state of the resistance change material layer 110 are determined, thereby performing a read operation.

When a nonvolatile memory device is manufactured using resistance change type nonvolatile memory cells, a trap state of the resistance change material layer 110 of the resistance change type nonvolatile memory cells is not uniform, and thus there is a slight difference in the current-voltage curve of the resistance change material layer 110. The difference in the current-voltage curve of the resistance change material layer 110 of the resistance change type nonvolatile memory cells damages the operation stability. As shown in the present embodiment, the current-voltage curve of the resistance change material layer 110 may be adjusted through the control of the gate voltage applied to the ferroelectric layer 120, and thus the difference in the current-voltage curve of the resistance change type nonvolatile memory cells 100 may be reduced and/or minimized, thereby improving the operation stability of the nonvolatile memory device.

Figure 9:
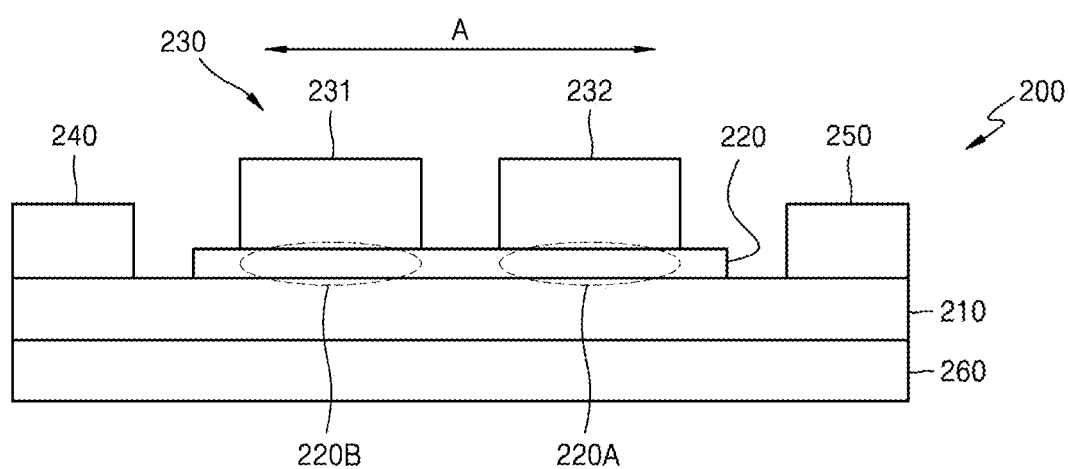
FIG. 9 is a structural diagram of a nonvolatile memory cell according to an embodiment.

FIG. 9 is a structural diagram of a nonvolatile memory cell 200 according to an embodiment. Referring to FIG. 9, the nonvolatile memory cell 200 according to the present embodiment includes a resistance change material layer 210 and a ferroelectric layer 220 provided on the resistance change material layer 210. Two first electrodes 231 and 232 are provided on the ferroelectric layer 220. A second electrode 240 and a third electrode 250 are provided on the resistance change material layer 210 with the two first electrodes 231 and 232 interposed therebetween. The two first electrodes 231 and 232 are spaced apart from each other in a separation direction A in which the second electrode 240 and the third electrode 250 are spaced. The two first electrodes 231 and 232 are non-limiting examples and three or more first electrodes may be provided. The nonvolatile memory cell 200 according to the present embodiment is substantially the same as the nonvolatile memory cell 100 described with reference to FIGS. 1 to 8 except that a plurality of first electrodes 230 are provided in place of one first electrode 130, and thus differences will be described.

As an example, the gate voltage may be independently applied to each of the two first electrodes 230 (231 and 232). Since the first electrode 230 (231 and 232) determines the polarization state of two regions 220A and 220B of the ferroelectric layer 220 disposed directly below, the combination of polarization in the up-state and polarization in the down-state may be possible in the ferroelectric layer 220. In other words, the nonvolatile memory cell 200 of the present embodiment may store three pieces of information of a high resistance state, an intermediate resistance state, and a low resistance state.

As another example, the same gate voltage may be applied to the two first electrodes 230 such that the nonvolatile memory cell 200 may store two pieces of information of a high resistance state and a low resistance state.

Figure 10:
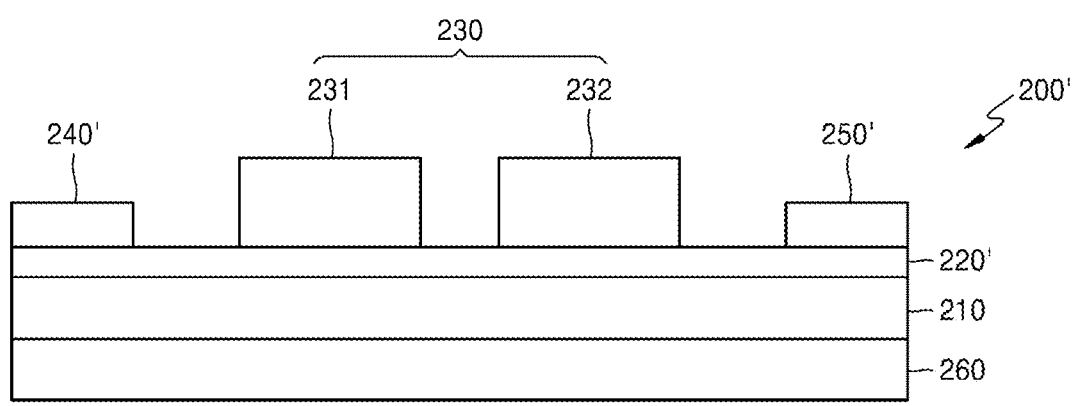
FIG. 10 is a structural diagram of a nonvolatile memory cell according to an embodiment.

FIG. 10 is a structural diagram of a nonvolatile memory cell 200' according to an embodiment. Referring to FIG. 10, the nonvolatile memory cell 200' of the present embodiment includes the resistance change material layer 210 and a ferroelectric layer 220' provided on the resistance change material layer 210. The two first electrodes 231 and 232 are provided on the ferroelectric layer 220'. A second electrode 240' and a third electrode 250' are provided on the ferroelectric layer 220' with the two first electrodes 231 and 232 interposed therebetween. The nonvolatile memory cell 200' of the present embodiment is substantially the same as the nonvolatile memory cell 200 described with reference to FIG. 9 except for the formation positions of the second electrode 240' and the third electrode 250'.

Figure 11:
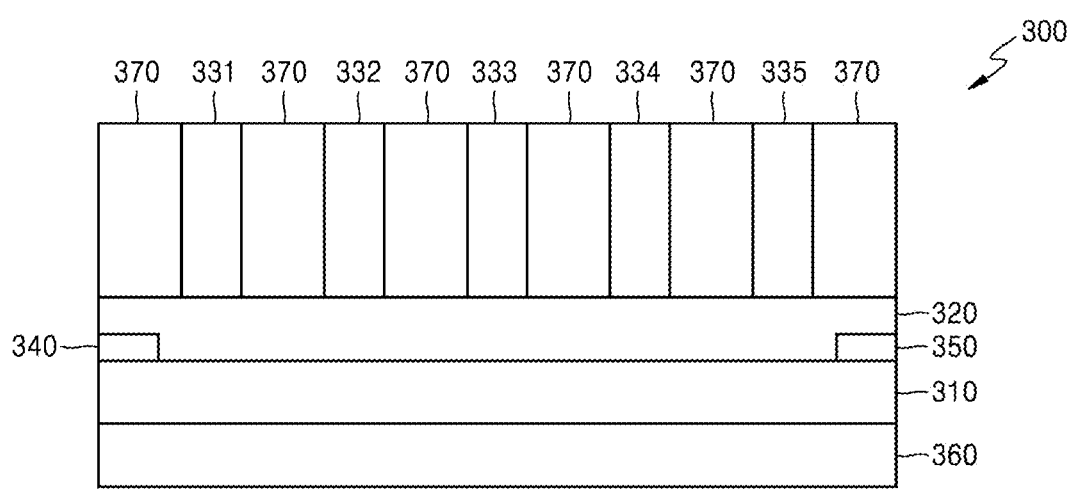
FIG. 11 is a structural diagram of a nonvolatile memory cell according to an embodiment.

FIG. 11 is a structural diagram of a nonvolatile memory cell 300 according to an embodiment. Referring to FIG. 11, the nonvolatile memory cell 300 according to the present embodiment includes a resistance change material layer 310 and a ferroelectric layer 320 provided on the resistance change material layer 310. A plurality of first electrodes 331, 332, 333, 334, and 335 are provided on the ferroelectric layer 320. A second electrode 340 and a third electrode 350 are provided on the resistance change material layer 310 with the plurality of first electrodes 331, 332, 333, 334, and 335 interposed therebetween. The second electrode 340 and the third electrode 350 may be positioned between the resistance change material layer 310 and the ferroelectric layer 320. The plurality of first electrodes 331, 332, 333, 334, and 335 may be spaced apart from each other with respect to a separation direction in which the second electrode 340 and the third electrode 350 are spaced apart from each other. Insulating layers 370 may be interposed between the plurality of first electrodes 331, 332, 333, 334, and 335 to insulate the plurality of first electrodes 331, 332, 333, 334, and 335 from each other. FIG. 11 illustrates a case in which the five first electrodes 331, 332, 333, 334, and 335 are provided, but the present disclosure is not limited thereto. A gate voltage may be independently applied to each of the plurality of first electrodes 331, 332, 333, 334, and 335.

Figure 12:
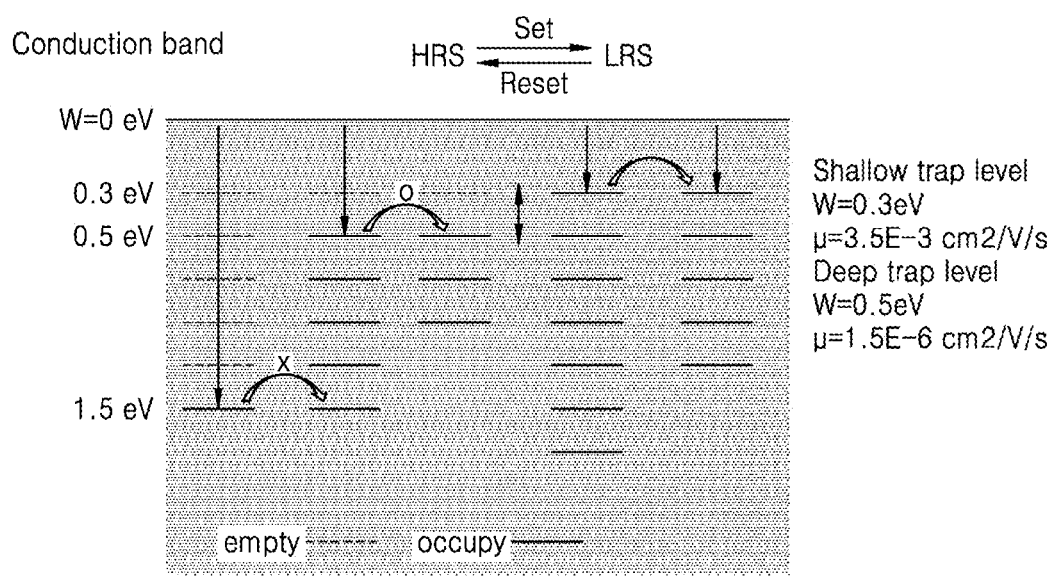
FIG. 12 is a diagram illustrating non-uniformity of resistance in a resistance change material layer of the nonvolatile memory cell of FIG. 11.

FIG. 12 is a diagram illustrating a non-uniformity of resistance in the resistance change material layer 310 of the nonvolatile memory cell 300 of FIG. 11. Referring to FIG. 12, the switching characteristics become non-uniform because trap states of a deep trap energy level and a shallow trap energy level are not uniform due to a hopping conduction in the resistance change material layer 310. Correspondingly, the magnitude of a gate voltage applied to each of the plurality of first electrodes 331, 332, 333, 334, and 335 is adjusted, thereby making the resistance of the change material layer 310 uniform through calibration of adjusting the polarization strength of the ferroelectric layer 320 for each region, and the operation stability of the nonvolatile memory cell 300 may be improved.

Figure 13:
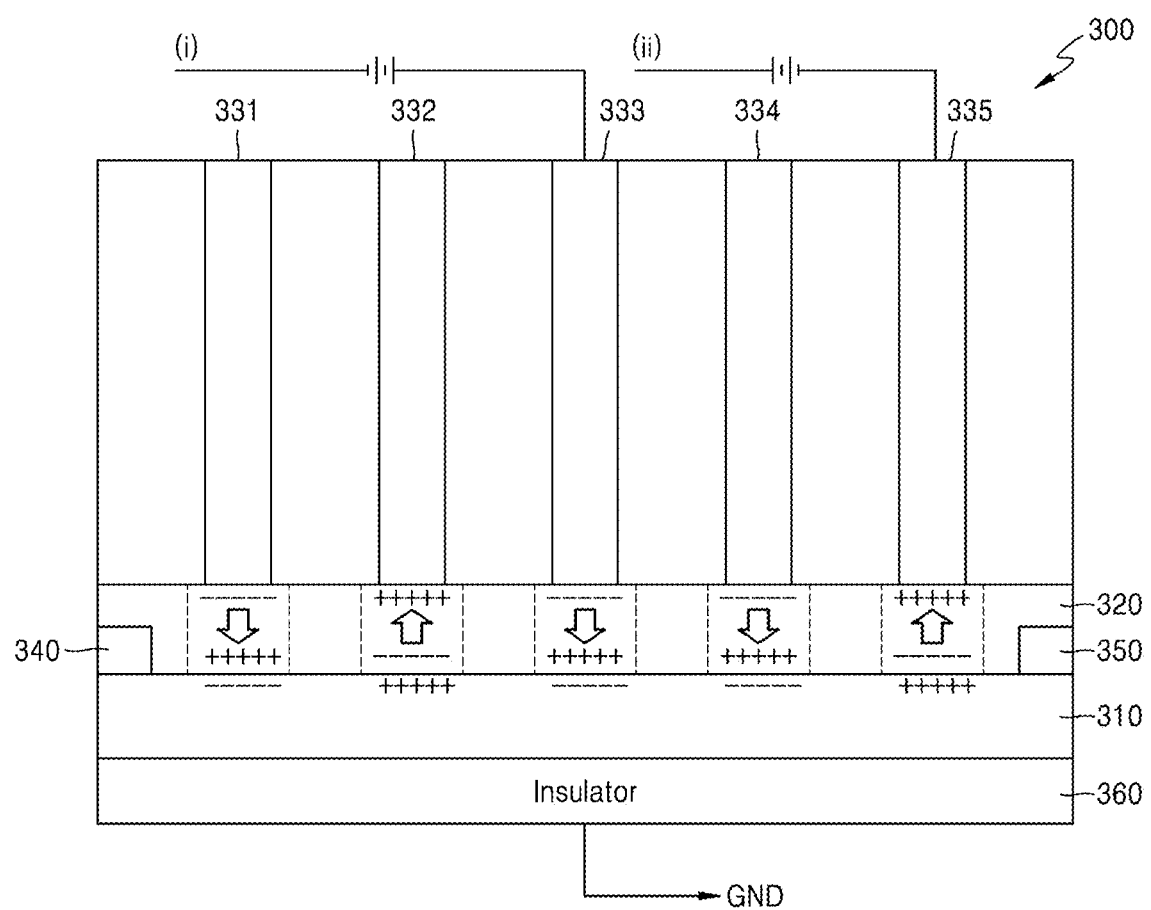
FIG. 13 is a diagram illustrating a write operation performed on the nonvolatile memory cell of FIG. 11 according to an embodiment.

FIG. 13 is a diagram illustrating a write operation performed on the nonvolatile memory cell 300 of FIG. 11 according to an embodiment. Referring to case (i) of FIG. 13, when a positive voltage is applied to any one or a plurality (e.g., 333) of the plurality of first electrodes 331, 332, 333, 334, and 335, the corresponding region of the ferroelectric layer 320 forms a polarization in the down-state. Referring to case (ii) of FIG. 13, when a negative voltage is applied to any one or a plurality (e.g., 335) of the plurality of first electrodes 331, 332, 333, 334, and 335, the corresponding region of the ferroelectric layer 320 forms a polarization in the up-state. Cases (i) and (ii) of FIG. 13 may be performed independently from each other. Accordingly, the ferroelectric layer 320 has polarization states as many as the number of the first electrodes 331, 332, 333, 334, and 335 in lower regions of the plurality of first electrodes 331, 332, 333, 334, and 335. In addition, the resistance change material layer 310 has a low resistance state or a high resistance state corresponding to the polarization states of the ferroelectric layer 320 by the number of the plurality of first electrodes 331, 332, 333, 334, and 335. A combination of low resistance states or high resistance states corresponding to polarization states of the ferroelectric layer 320 of the resistance change material layer 310 may correspond to information written to the nonvolatile memory cell 300. As such, the gate voltage is applied to each of the plurality of first electrodes 331, 332, 333, 334, and 335, thereby performing the write operation of writing information onto the nonvolatile memory cell 300.

Figure 14:
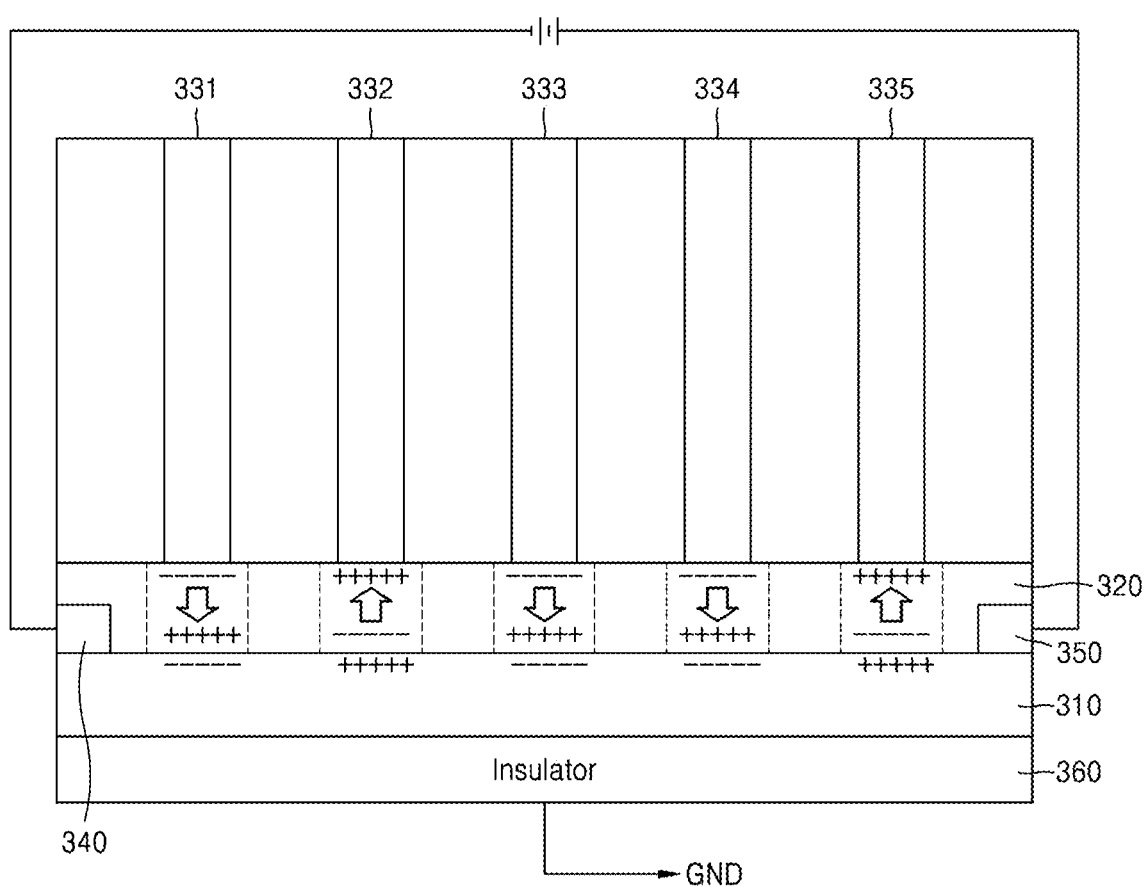
FIG. 14 is a diagram illustrating a read operation performed on the nonvolatile memory cell of FIG. 11 according to an embodiment.

FIG. 14 is a diagram illustrating a read operation performed on the nonvolatile memory cell 300 of FIG. 11 according to an embodiment. Referring to FIG. 14, in the nonvolatile memory cell 300 on which information is recorded as shown in FIG. 13, a drain voltage is applied between the second electrode 340 and the third electrode 350, and thus a drain current between the second electrode 340 and the third electrode 350 is detected. As described with reference to FIG. 13, the resistance change material layer 310 has a combination of low resistance states or high resistance states corresponding to polarization states of the ferroelectric layer 320, and thus, the overall resistance value of the resistance change material layer 310 may be the sum of low resistance states or high resistance states corresponding to the polarization states in the ferroelectric layer 320. Since the resistance state of the resistance change material layer 310 is identified through the detected drain current, information recorded on the nonvolatile memory cell 300 may be read.

Figure 15:
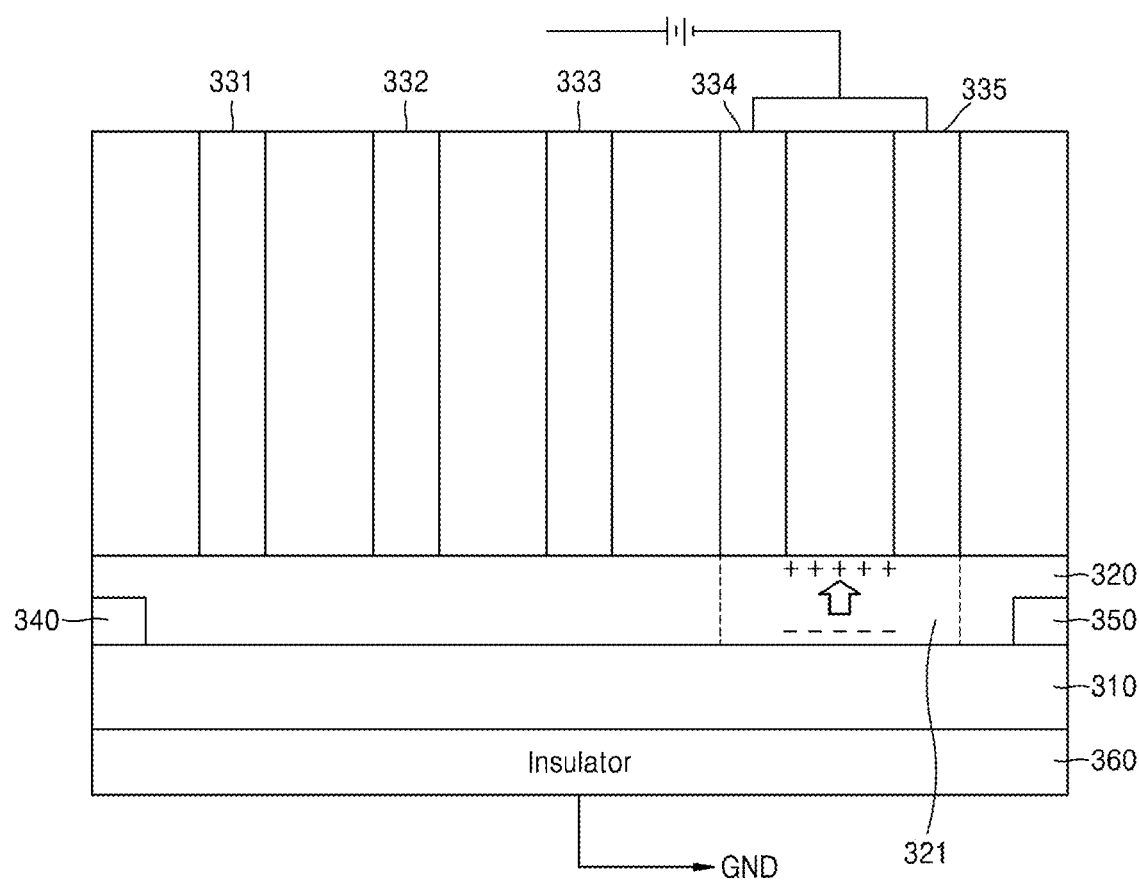
FIG. 15 is a diagram illustrating a write primary operation performed on the nonvolatile memory cell of FIG. 11 according to an embodiment.

FIG. 15 is a diagram illustrating a write primary operation performed on the nonvolatile memory cell 300 of FIG. 11 according to an embodiment. Referring to FIG. 15, the same negative gate voltage is applied to each of two neighboring first electrodes (e.g., the 1-4th electrode 334 and the first to fifth electrodes 335) among the plurality of first electrodes 331, 332, 333, 334, and 335 5. Accordingly, polarization in the same up-state is formed in the corresponding region (hereinafter, referred to as a first region 321) of the ferroelectric layer 320 positioned in lower portions of the two neighboring 1-4th electrode 334 and 1-5th electrode 335 and a lower portion between the 1-4th electrode 334 and the 1-5th electrode 335.

Figure 16:
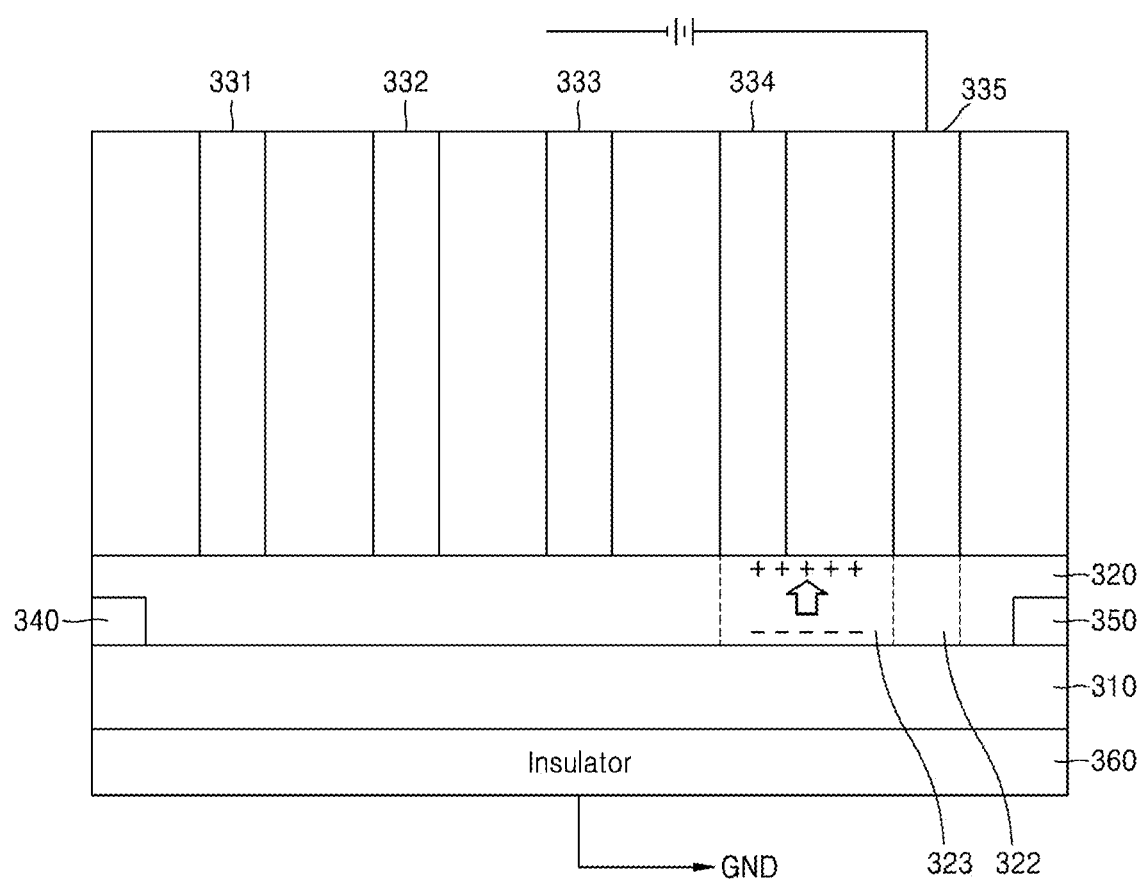
FIG. 16 is a diagram illustrating a reset operation subsequent to the write primary operation of FIG. 15.

FIG. 16 is a diagram illustrating a reset operation subsequent to the write primary operation of FIG. 15. Referring to FIG. 16, a positive gate voltage of a polarity opposite to that of a gate voltage applied in the write primary operation is applied to any one (e.g., the 1-5th electrode 335) of the two first electrodes that applied the voltage in the write primary operation, and thus the polarization state of the corresponding region (hereinafter, referred to as a second region 322) of the ferroelectric layer 320 positioned in a lower portion of the first to fifth electrodes 335 is reset. A third region 323 of the first region 321 that does not overlap with the second region 322 maintains a polarization in the up-state formed in the write primary operation. The reset operation may be omitted.

Figure 17:
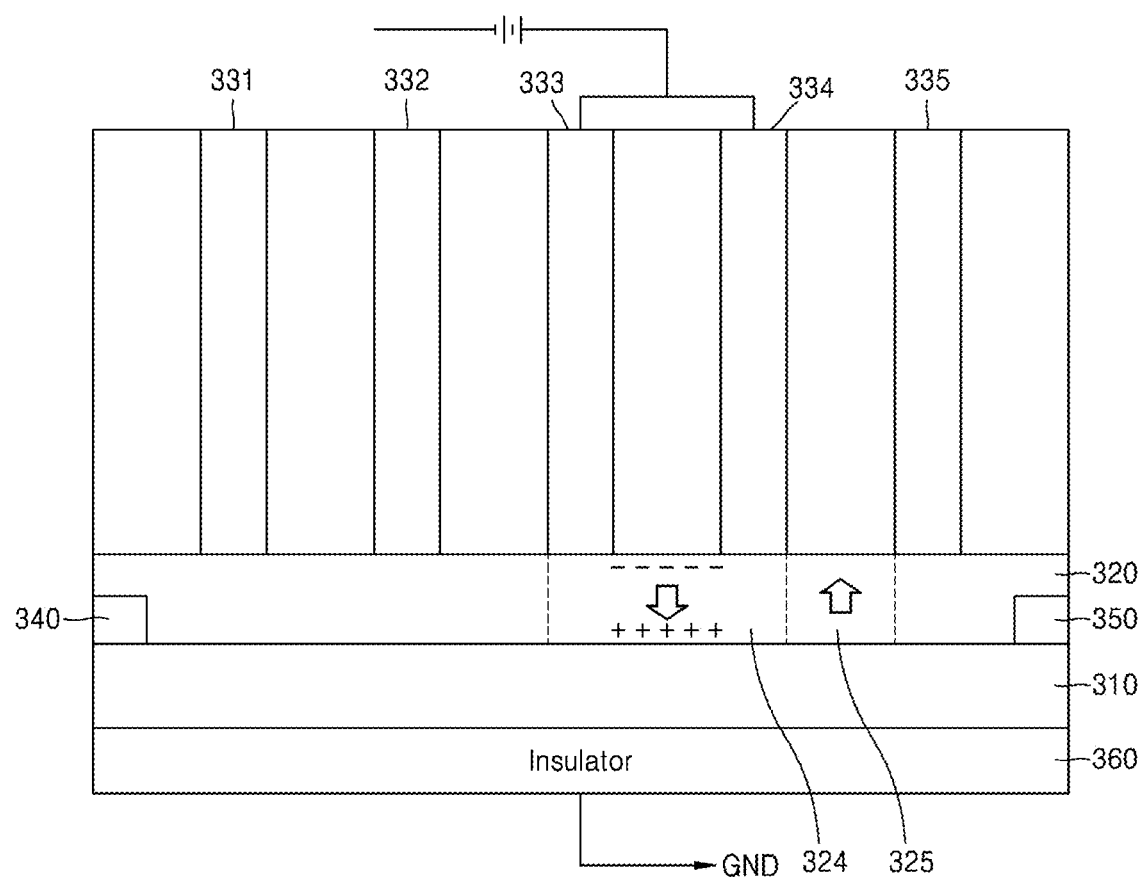
FIG. 17 is a diagram illustrating a write secondary operation subsequent to the write primary operation of FIG. 15.

FIG. 17 is a diagram illustrating a write secondary operation subsequent to the write primary operation of FIG. 15. Referring to FIG. 17, the same positive gate voltage is applied to two neighboring first electrodes (e.g., the 1-3th electrode 333 and the 1-4th electrode 334) among the plurality of first electrodes 331, 332, 333, 334, and 335. One (e.g., the 1-4th electrode 334) of the two neighboring 1-3th electrode 333 and 1-4th electrode 334 is an electrode to which a negative gate voltage is applied in the write primary operation. The corresponding region (hereinafter referred to as a fourth region 324) of the ferroelectric layer 320 positioned in lower portions of the two neighboring 1-3th electrode 333 and 1-4th electrode 334 and in a lower portion between the 1-3th electrode 333 and the 1-4th electrode 334 forms a polarization in the same down-state. The polarization of the up-state is maintained in a fifth region 325 which does not overlap the fourth region 324 in the third region 323 in which the polarization of the up-state is maintained in the reset operation. Subsequently, the reset operation of FIG. 16 and the write operation of FIG. 17 are sequentially performed on neighboring electrodes.

Figure 18:
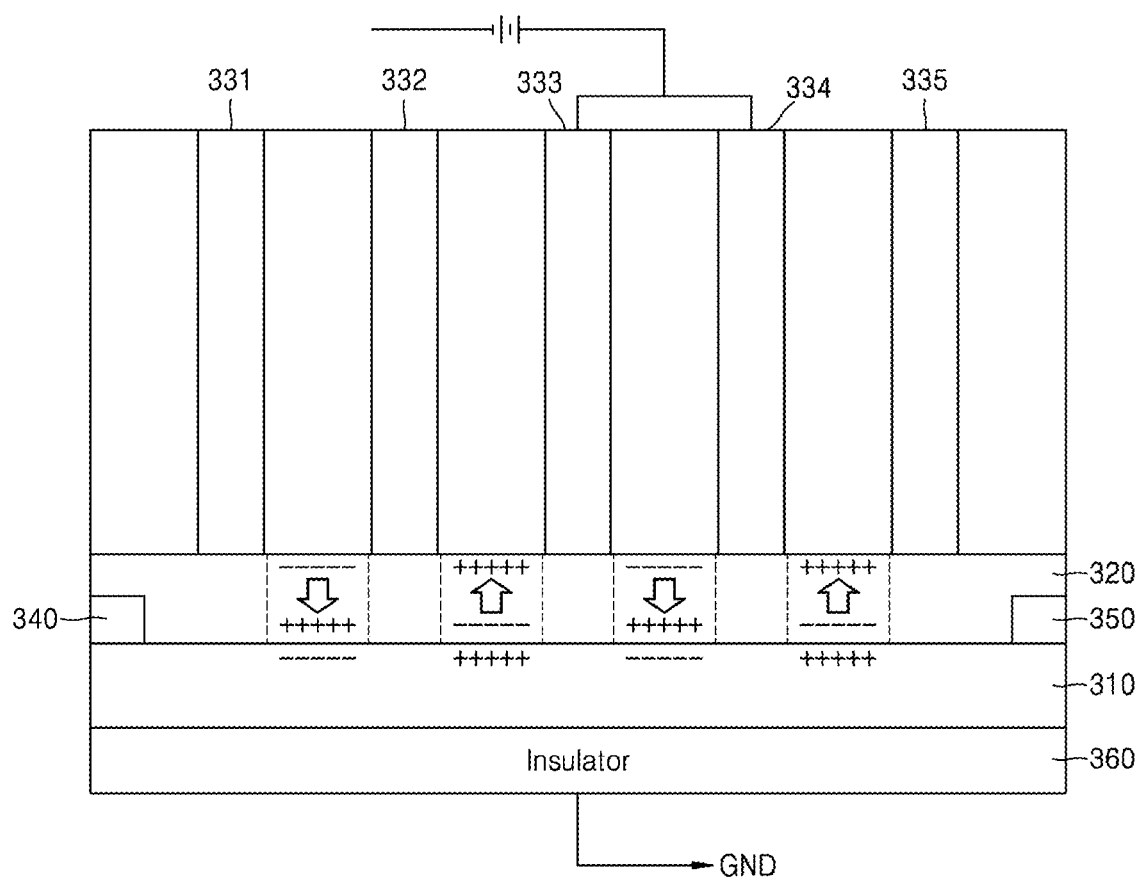
FIG. 18 is a diagram illustrating a result of a write operation according to the embodiment of FIGS. 15 to 17.

FIG. 18 is a diagram illustrating a result of a write operation according to the embodiment of FIGS. 15 to 17. Referring to FIG. 18, the nonvolatile memory cell 300 of FIG. 11 repeats the write operation according to the embodiment of FIGS. 15 to 17, thereby forming polarization in the corresponding regions of the ferroelectric layer 320 corresponding to regions between the plurality of first electrodes 331, 332, 333, 334, and 335. Therefore, according to the result of the write operation according to the present embodiment, the ferroelectric layer 320 has the number of polarization states smaller by 1 than the number of the plurality of first electrodes 331, 332, 333, 334, and 335. In addition, the resistance change material layer 310 also has the number of low resistance states or high resistance states smaller by 1 than the number of the plurality of first electrodes 331, 332, 333, 334, and 335. A combination of low resistance states or high resistance states of the resistance change material layer 310 may correspond to information written on the nonvolatile memory cell 300.

Figure 19:
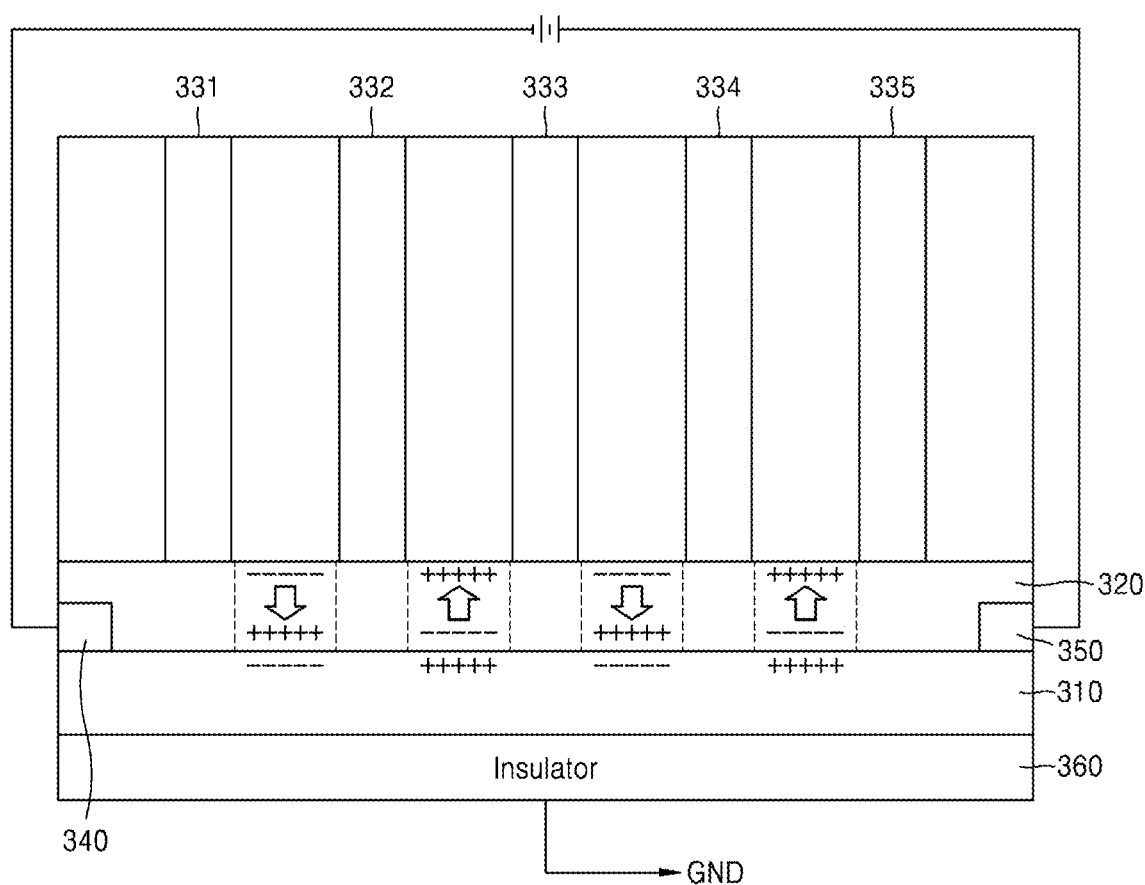
FIG. 19 is a diagram illustrating a read operation of the nonvolatile memory cell of FIG. 11 according to an embodiment.

FIG. 19 is a diagram illustrating a read operation of the nonvolatile memory cell 300 of FIG. 11 according to an embodiment. Referring to FIG. 19, in the nonvolatile memory cell 300 on which information is recorded as shown in FIG. 18, a drain voltage is applied between the second electrode 340 and the third electrode 350, and thus a drain current between the second electrode 340 and the third electrode 350 is detected. Since the resistance state of the resistance change material layer 310 is identified through the detected drain current, information recorded on the nonvolatile memory cell 300 may be read.

Figure 20:
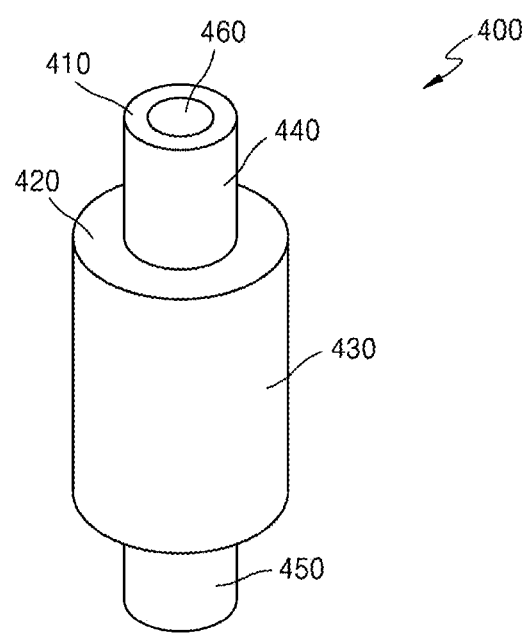
FIG. 20 is a structural diagram of a nonvolatile memory cell according to an embodiment.

FIG. 20 is a structural diagram of a nonvolatile memory cell 400 according to an embodiment. Referring to FIG. 20, the resistance change type nonvolatile memory cell 400 of the present embodiment includes a resistance change material layer 410 having a cylindrical shape. The ferroelectric layer 420 is provided around an outer wall of the cylindrical shape of the resistance change material layer 410. A first electrode 430 is provided around the outer wall of the ferroelectric layer 420. The second electrode 440 and the third electrode 450 are provided around the outer circumference of the resistance change material layer 410 with the first electrode 430 interposed therebetween. FIG. 20 illustrates that the second electrode 440 and the third electrode 450 are not covered by the ferroelectric layer 420, but the present disclosure is not limited thereto. For example, the second electrode 440 and the third electrode 450 may be interposed between the resistance change material layer 410 and the ferroelectric layer 420, or may be provided around the outer wall of the ferroelectric layer 420.

A fourth electrode 460 may be provided on the cylindrical inner wall of the resistance change material layer 410. The fourth electrode 460 may be grounded. An insulator may be provided on the cylindrical inner wall of the resistance change material layer 410 instead of the fourth electrode 460. The fourth electrode 460 or the insulator may have a cylindrical shape.

The nonvolatile memory cell 400 of the present embodiment is substantially the same as the nonvolatile memory cell 100 described with reference to FIGS. 1 to 8, and thus a redundant description thereof will be omitted.

Figure 21:
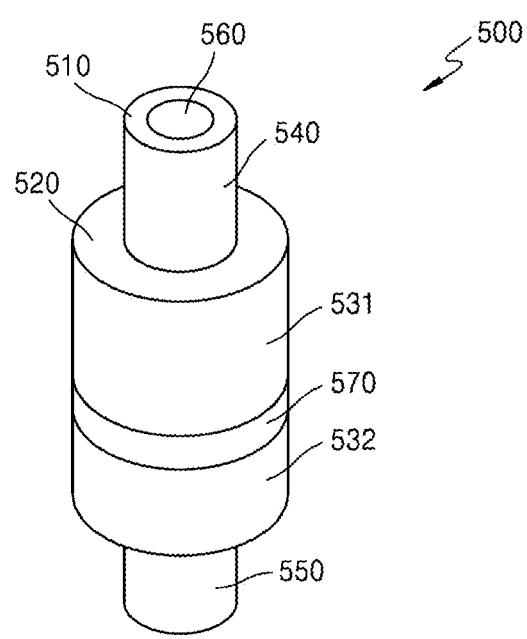
FIG. 21 is a structural diagram of a nonvolatile memory cell according to an embodiment.

FIG. 21 is a structural diagram of a nonvolatile memory cell 500 according to an embodiment. Referring to FIG. 21, the nonvolatile memory cell 500 according to the present embodiment includes a resistance change material layer 510 in a cylindrical shape and a ferroelectric layer 520 provided around the outer wall of the resistance change material layer 510. Two first electrodes 531 and 532 are provided on the ferroelectric layer 520. An insulating layer 570 is provided between the two first electrodes 531 and 532. A second electrode 540 and a third electrode 550 are provided around the outer wall of the resistance change material layer 510 with the two first electrodes 531 and 532 interposed therebetween. The two first electrodes 531 and 532 are spaced apart from each other with respect to a separation direction (e.g., a cylindrical axis direction) in which the second electrode 540 and the third electrode 550 are spaced apart from each other. The two first electrodes 531 and 532 are non-limiting examples and three or more first electrodes may be provided. The nonvolatile memory cell 500 according to the present embodiment is substantially the same as the nonvolatile memory cell 400 described with reference to FIG. 20 except that a plurality of first electrodes 430 are provided in place of one first electrode 430.

The nonvolatile memory cell 500 of the present embodiment is substantially the same as the nonvolatile memory cell 200 described with reference to FIG. 9, and thus a redundant description thereof will be omitted.

Figure 22:
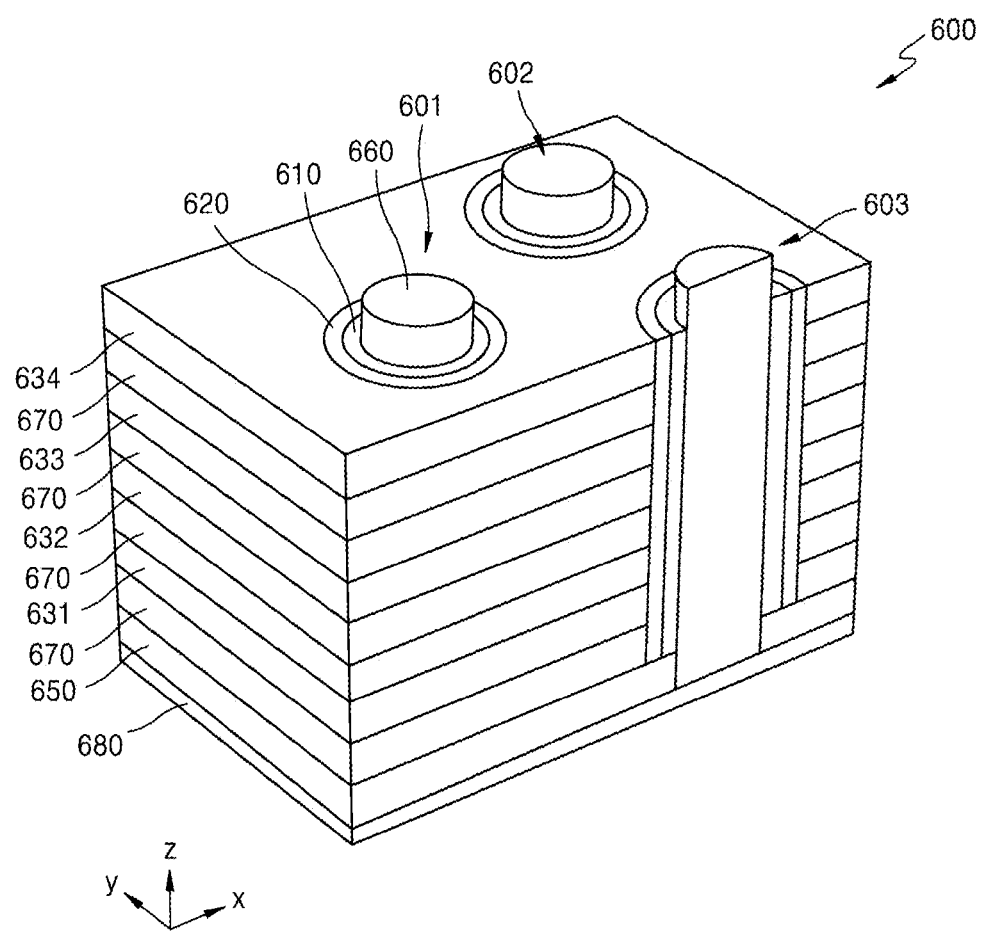
FIG. 22 is a structural diagram of a nonvolatile memory cell according to an embodiment.

FIG. 22 is a structural diagram of a nonvolatile memory cell 600 according to an embodiment. Referring to FIG. 22, in the nonvolatile memory cell 600, a plurality of unit nonvolatile memory cells 601, 602, and 603 are vertically erected on a substrate 680. Each of the plurality of unit nonvolatile memory cells 601, 602, and 603 may be the nonvolatile memory cell 500 described with reference to FIG. 21. Each of the plurality of unit nonvolatile memory cells 601, 602, and 603 includes a fourth electrode 660 of a cylindrical shape vertically erected on the substrate 680. A cylindrical insulator may be provided in place of the fourth electrode 660. A resistance change material layer 610 is formed around the outer wall of the cylindrical shape of the fourth electrode 660. A third electrode 650 is formed on the substrate 680 while being electrically connected to the resistance change material layer 610. A ferroelectric layer 620 is formed around the outer wall of the resistance change material layer 610. On the outer wall of the ferroelectric layer 620, the first electrodes 631, 632, 633, and 634 and the insulator layer 670 are alternately stacked on the third electrode 650. A second electrode (not shown) is formed on the stack structure of the first electrodes 631, 632, 633, and 634 and the insulator layer 670 while being electrically connected to the resistance change material layer 610. In the present embodiment, the three unit nonvolatile memory cells 601, 602, and 603 are non-limiting examples, and four or more unit nonvolatile memory cells may be provided.

Figure 23:
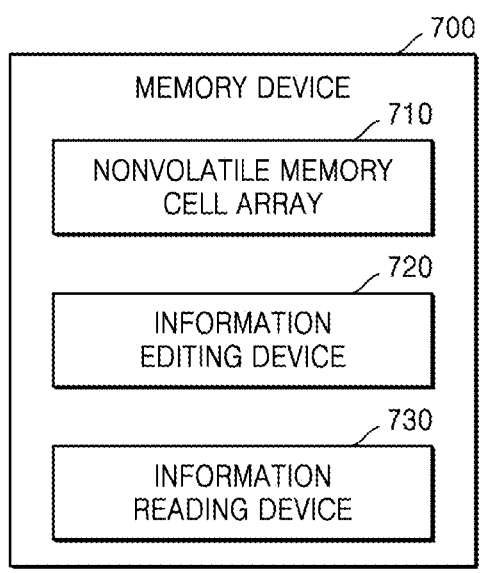
FIG. 23 is a block diagram of a nonvolatile memory device according to an embodiment.

FIG. 23 is a block diagram illustrating a nonvolatile memory device 700 according to an embodiment.

Referring to FIG. 23, the resistance change type nonvolatile memory device 700 may include a nonvolatile memory cell array 710, an information editing device 720, and an information reading device 730.

The nonvolatile memory cell array 710 stores information by changing an electrical resistance with an application of electrical stress, and may be formed by arranging the resistance change type nonvolatile memory cells 100, 100', 100", 200, 200', 300, 400, 500 and 600 of the above-described embodiments.

The information editing device 720 applies the electrical stress to one of the resistance change type nonvolatile memory cells 100, 100', 100", 200, 200', 300, 400, 500 and 600 or a plurality of first electrodes to change the electric resistance of resistance change material layers of the resistance change type nonvolatile memory cells 100, 100', 100", 200, 200', 300, 400, 500 and 600, thereby writing and deleting information. The information editing device 720 switches a forward bias voltage and a backward bias voltage with respect to an interface of the resistance change material layers and the ferroelectric layers of the resistance change type nonvolatile memory cells 100, 100', 100", 200, 200', 300, 400, 500 and 600 as the electrical stress during a read operation and a delete operation, thereby changing the resistance of the resistance change type nonvolatile memory cells 100, 100', 100", 200, 200', 300, 400, 500 and 600.

The information editing device 720 switches a forward bias voltage and a backward bias voltage with respect to the ferroelectric layers of the resistance change type nonvolatile memory cells 100, 100', 100", 200, 200', 300, 400, 500 and 600 as the electrical stress during a write operation and the delete operation, thereby changing the resistance of the resistance change material layers of the resistance change type nonvolatile memory cells 100, 100', 100", 200, 200', 300, 400, 500 and 600.

The information editing device 720 independently adjusts voltages with respect to the plurality of first electrodes of the resistance change type nonvolatile memory cells 100, 100', 100", 200, 200', 300, 400, 500 and 600, thereby calibrating the resistance of the resistance change material layers of the resistance change type nonvolatile memory cells 100, 100', 100", 200, 200', 300, 400, 500 and 600.

The information editing device 720 and/or information reading device 730 may implemented with processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The information editing device 720 and/or information reading device 730 may operate in response to control signals, commands, or instructions input thereto from an external source (e.g., host, not shown) a host (not shown) and may be configured to access the memory cell array 710 and control operations of the resistance change type nonvolatile memory device 700 may include a nonvolatile memory cell array 710 discussed herein, thereby transforming the information editing device 720 and/or information reading device 730 into special purpose processing circuitry.

According to an embodiment, the resistance change type nonvolatile memory cell 700 includes the resistance change type nonvolatile memory cells 100, 100', 100", 200, 200', 300, 400, 500 and 600, and the information editing device 720 controls the polarization direction and the polarization size of the ferroelectric layers of the resistance change type nonvolatile memory cells 100, 100', 100", 200, 200', 300, 400, 500 and 600, thereby calibrating resistances of the resistance change material layers of the resistance change type nonvolatile memory cells 100, 100', 100", 200, 200', 300, 400, 500 and 600.

The nonvolatile memory device of the above-described embodiment may be implemented in the form of a chip and used as a neuromorphic computing platform.

In some embodiments, the nonvolatile memory device may be applied to a neuromorphic circuit and/or neuromorphic apparatus in a machine learning system. The machine learning system may utilize a variety of artificial neural network organizational and processing models, such as convolutional neural networks (CNN), deconvolutional neural networks, recurrent neural networks (RNN) optionally including long short-term memory (LSTM) units and/or gated recurrent units (GRU), stacked neural networks (SNN), state-space dynamic neural networks (SSDNN), deep belief networks (DBN), generative adversarial networks (GANs), and/or restricted Boltzmann machines (RBM).

Alternatively or additionally, such machine learning systems may include other forms of machine learning models, such as, for example, linear and/or logistic regression, statistical clustering, Bayesian classification, decision trees, dimensionality reduction such as principal component analysis, and expert systems; and/or combinations thereof, including ensembles such as random forests. Such machine learning models may also be used to provide various services and/or applications, e.g., an image classify service, a user authentication service based on bio-information or biometric data, an advanced driver assistance system (ADAS) service, a voice assistant service, an automatic speech recognition (ASR) service, or the like, may be performed, executed or processed by electronic devices.

The nonvolatile memory cell and the nonvolatile memory device including the nonvolatile memory cell described above have been described with reference to the embodiments illustrated in the drawings for clarity, but these merely non-limiting examples, and it will be understood by those skilled in the art that various modifications and equivalent other embodiments therefrom are possible. Therefore, the true technical protection scope of the present disclosure will be defined by the appended claims.

According to the present disclosure, the nonvolatile memory cell and the nonvolatile memory device including the nonvolatile memory cell may have improved electrical characteristics.

According to the present disclosure, the operation stability of the nonvolatile memory cell and the nonvolatile memory device including the nonvolatile memory cell may be improved.

However, the effects of embodiments of inventive concepts are not limited to the above disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A resistance change type nonvolatile memory cell configured to store information by changing an electrical resistance according to an application of electrical stress, the resistance change type nonvolatile memory cell comprising:
   a resistance change material layer including a resistance change material;
   a ferroelectric layer on a first side of the resistance change material layer, the ferroelectric layer configured to change an electrical resistance of the resistance change material layer according to a polarization direction and a polarization size of a ferroelectric therein;
   one or a plurality of first electrodes on the ferroelectric layer, the one or the plurality of first electrodes configured to control the polarization direction and the polarization size of the ferroelectric based on a voltage applied to the one or the plurality of first electrodes; and
   a second electrode and a third electrode on the resistance change material layer with the one or the plurality of first electrodes therebetween the second electrode and the third electrode.

2. The resistance change type nonvolatile memory cell of claim 1, wherein the resistance change material layer has a flat plate shape.

3. The resistance change type nonvolatile memory cell of claim 2, wherein the second electrode and the third electrode are between the resistance change material layer and the ferroelectric layer, or the second electrode and the third electrode are on the ferroelectric layer.

4. The resistance change type nonvolatile memory cell of claim 2, further comprising:
a fourth electrode or an insulator on a lower surface of the resistance change material layer, wherein
the ferroelectric layer is on an upper surface of the resistance change material layer.

5. The resistance change type nonvolatile memory cell of claim 1, wherein
the resistance change material layer has a cylindrical shape,
the ferroelectric layer is around an outer wall of the resistance change material layer,
the one or the plurality of first electrodes is provided around an outer circumference of the ferroelectric layer, and
the second electrode and the third electrode have a cylindrical shape, and
the second electrode and the third electrode are provided around the outer circumference of the resistance change material layer with the one or the plurality of first electrodes therebetween.

6. The resistance change type nonvolatile memory cell of claim 5, wherein the second electrode and the third electrode are positioned between the resistance change material layer and the ferroelectric layer or on the outer circumference of the ferroelectric layer.

7. The resistance change type nonvolatile memory cell of claim 5, further comprising:
a fourth electrode or an insulator on an inner wall of the resistance change material layer.

8. The resistance change type nonvolatile memory cell of claim 7, wherein the fourth electrode or the insulator has a cylindrical shape.

9. The resistance change type nonvolatile memory cell of claim 1, wherein the one or the plurality of first electrodes is a plurality of first electrodes are spaced apart from each other along a separation direction in which the second electrode and the third electrode are spaced apart from each other.

10. The resistance change type nonvolatile memory cell of claim 1, wherein the ferroelectric layer includes at least one of an oxide comprising Hf, an oxide comprising Ba and Ti, an oxide comprising Pb and Zr, and an oxide comprising Bi and Fe.

11. The resistance change type nonvolatile memory cell of claim 1, wherein the ferroelectric layer includes $HfO_2$ or $Hf_{1-x}T_xO_y$ (where $0<x<1$, $y>0$, and T=Al, Zr, Si, Ge, Sn, In, Ga, Sb, Ti, La, Ta, W, Mo, Nb, Y, rare earth, Mg, Ca, Sr, and Ba).

12. The resistance change type nonvolatile memory cell of claim 1, wherein the resistance change material layer includes a bicomponent oxide, a tricomponent oxide, or a tetracomponent oxide.

13. The resistance change type nonvolatile memory cell of claim 1, wherein the one or the plurality of first electrodes, the second electrode, and the third electrode each include an oxide having conductivity, a nitride having conductivity, or a metal.

14. The resistance change type nonvolatile memory cell of claim 1, wherein the one or the plurality of first electrodes are one or more gate electrodes, the second electrode is a source electrode, and the third electrode is a drain electrode.

15. The resistance change type nonvolatile memory cell of claim 1, wherein the resistance change material layer is grounded.

16. A resistance change type nonvolatile memory device comprising:
the resistance change type nonvolatile memory cell of claim 1; and
processing circuitry,
the processing circuitry configured to apply the electrical stress to the one or the plurality of first electrodes of the resistance change type nonvolatile memory cell, change the electrical resistance of the resistance change material layer of the resistance change type nonvolatile memory cell, and write and delete information, and
the processing circuitry configured to apply a voltage to each of the second electrode and the third electrode of the resistance change type nonvolatile memory cell, detect an electrical resistance in an amount of current flowing between the second electrode and the third electrode, and read stored information.

17. The resistance change type nonvolatile memory device of claim 16, wherein
the processing circuitry is further configured to switch a forward bias voltage and a backward bias voltage with respect to an interface of the resistance change material layer and the ferroelectric layer of the resistance change type nonvolatile memory cell as the electrical stress during a read operation and a delete operation and change a resistance of the resistance change type nonvolatile memory cell.

18. The resistance change type nonvolatile memory device of claim 16, wherein
the processing circuitry is further configured to switch a forward bias voltage and a backward bias voltage with respect to a ferroelectric layer of the resistance change type nonvolatile memory cell as the electrical stress during a write operation and a delete operation and change a resistance of the resistance change material layer of the resistance change type nonvolatile memory cell.

19. The resistance change type nonvolatile memory device of claim 18, wherein
the one or the plurality of first electrodes of the resistance change type nonvolatile memory cell is the plurality of first electrodes, and
the processing circuitry is further configured to independently adjust voltages with respect to the plurality of first electrodes and calibrate a resistance of the resistance change material layer of the resistance change type nonvolatile memory cell.

20. The resistance change type nonvolatile memory device of claim 18, wherein
the resistance change type nonvolatile memory device includes a plurality of the resistance change type nonvolatile memory cells,
the plurality of resistance change type nonvolatile memory cells include the resistance change type nonvolatile memory cell, and
the processing circuitry is further configured to control a polarization direction and a polarization size of a ferroelectric layer of each of the plurality of resistance change type nonvolatile memory cells and calibrate resistances of resistance change material layers of the plurality of resistance change type nonvolatile memory cells.

21. A resistance change type nonvolatile memory cell comprising:

a resistance change material layer including a resistance change material;

a ferroelectric layer contacting the resistance change material layer, the ferroelectric layer configured to change an electrical resistance of the resistance change material layer according to a polarization direction and a polarization size of a ferroelectric therein; and a plurality of electrodes contacting the resistance change material layer and spaced apart from each other, the plurality of electrodes including a first electrode electrically connected to the ferroelectric layer, a second electrode on a first end of the resistance change material layer, and a third electrode on a second end of the resistance change material layer, and the first electrode configured to control the polarization direction and the polarization size of the ferroelectric based on a voltage applied to the first electrode.

22. The resistance change type nonvolatile memory cell of claim 21, wherein the ferroelectric layer includes at least one of an oxide comprising Hf, an oxide comprising Ba and Ti, an oxide comprising Pb and Zr, and an oxide comprising Bi and Fe.

23. The resistance change type nonvolatile memory cell of claim 21, wherein the ferroelectric layer includes $HfO_2$ or $Hf_{1-x}T_xO_y$ (where $0<x<1$, $y>0$, and T=Al, Zr, Si, Ge, Sn, In, Ga, Sb, Ti, La, Ta, W, Mo, Nb, Y, rare earth, Mg, Ca, Sr, and Ba).

24. The resistance change type nonvolatile memory cell of claim 21, wherein the resistance change material layer includes a bicomponent oxide, a tricomponent oxide, or a tetracomponent oxide.

25. A resistance change type nonvolatile memory device comprising:

the resistance change type nonvolatile memory cell of claim 21.

* * * * *